United States Patent
Nakajima et al.

(10) Patent No.: US 8,392,131 B2
(45) Date of Patent: Mar. 5, 2013

(54) PORTABLE ELECTRONIC DEVICE AND METHOD FOR CONTROLLING THE SAME

(75) Inventors: Masayoshi Nakajima, Kanagawa (JP); Akira Koyama, Kanagawa (JP); Takanobu Hayakawa, Kanagawa (JP)

(73) Assignee: KYOCERA Corporation, Kyoto (JP)

( * ) Notice: Subject to any disclaimer, the term of this patent is extended or adjusted under 35 U.S.C. 154(b) by 285 days.

(21) Appl. No.: 12/810,807

(22) PCT Filed: Dec. 26, 2008

(86) PCT No.: PCT/JP2008/073855
§ 371 (c)(1),
(2), (4) Date: Jun. 25, 2010

(87) PCT Pub. No.: WO2009/084686
PCT Pub. Date: Jul. 9, 2009

(65) Prior Publication Data
US 2010/0274509 A1    Oct. 28, 2010

(30) Foreign Application Priority Data
Dec. 27, 2007   (JP) ................... 2007-336661

(51) Int. Cl.
*G01R 31/36* (2006.01)
(52) U.S. Cl. .......... 702/63; 320/106; 320/130; 320/131; 320/132; 324/427; 324/430
(58) Field of Classification Search ....... 702/63
See application file for complete search history.

(56) References Cited

U.S. PATENT DOCUMENTS
5,620,810 A    4/1997   Golovin et al.
5,780,992 A *  7/1998   Beard ................ 320/106
(Continued)

FOREIGN PATENT DOCUMENTS
JP   H02-294231      5/1990
JP   H05-064301 A    3/1993
JP   H05-74501       3/1993
JP   2004-281076     7/2004
(Continued)

OTHER PUBLICATIONS

Office Action dated Jun. 7, 2012, issued in related U.S. Appl. No. 12/810,803.

(Continued)

*Primary Examiner* — Andrew Schechter
*Assistant Examiner* — Haidong Zhang
(74) *Attorney, Agent, or Firm* — Procopio, Cory, Hargreaves & Savitch LLP

(57) ABSTRACT

Provided are a portable electronic device which accurately judges service life of a battery even when the battery is replaced, and a method for controlling such portable electronic device. A control block (48) is provided with a voltage measuring section (100), which is connected to a rechargeable battery (32) and measures a voltage value of the rechargeable battery (32); and a control section (101), which measures the voltage of the rechargeable battery (32) by means of the voltage measuring section (100) each time recharging of the rechargeable battery (32) is started and ended, and controls to store recharge count information specified based on the measured voltage value in a storage section (42). The control section (101) performs prescribed information updating, based on the recharge count information, in the case where the recharge count information is acquired by means of an information acquiring section (49) which acquires the recharge count information relating to the rechargeable battery (32) from the external.

14 Claims, 7 Drawing Sheets

U.S. PATENT DOCUMENTS

| | | |
|---|---|---|
| 2002/0169572 A1 | 11/2002 | Suzuki et al. |
| 2004/0005497 A1* | 1/2004 | Nunomaki et al. ............. 429/92 |
| 2004/0196006 A1* | 10/2004 | Kawaguchi et al. .......... 320/132 |
| 2005/0017685 A1 | 1/2005 | Rees et al. |
| 2006/0164043 A1 | 7/2006 | Ukon |

FOREIGN PATENT DOCUMENTS

| | | |
|---|---|---|
| JP | 2004-264303 | 9/2004 |
| JP | 2004-349070 | 9/2004 |
| JP | 2007-87707 | 5/2007 |

OTHER PUBLICATIONS

Notice of Reasons for Rejection dated Apr. 24, 2012, issued in counterpart Japanese Application No. 2007-336661.

* cited by examiner

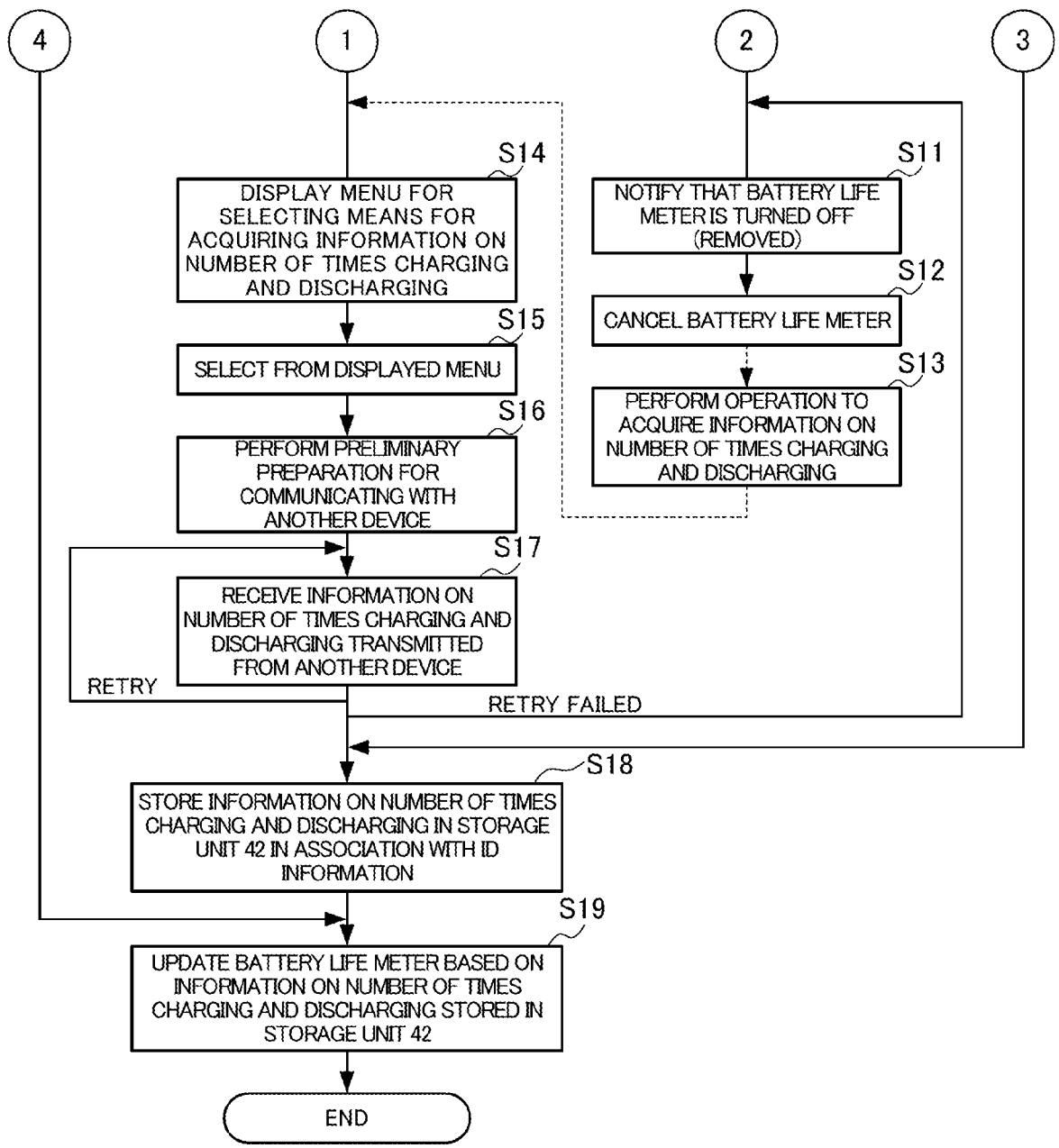

PORTABLE ELECTRONIC DEVICE AND METHOD FOR CONTROLLING THE SAME

TECHNICAL FIELD

The present invention relates to a portable electronic device to which a rechargeable battery is mounted, and particularly relates to a portable electronic device that outputs a usage state of a rechargeable battery, and a method of controlling the same.

BACKGROUND ART

Although lithium ion batteries are the current mainstream of batteries for cellular phones, due to the ever-increasing trend toward smaller sizes, lighter weight and higher functionality of mobile terminal devices (such as for continuously viewing a digital television program, continuously playing music, browsing WEB sites, etc.), it is anticipated that the cycle of charging and discharging a battery will be accelerated, and as a result, the life of a battery will tend to be shortened relative to the period of use of a mobile terminal device.

Here, methods of detecting the life of a battery include a method in which the life of a battery is determined by way of a change in an impedance value of the battery (for example, see Patent Document 1), and a method in which a function regarding a charging/discharging curve is stored in advance, and the life of a battery is determined by calculating and weighting a deterioration value when charging and discharging (for example, see Patent Document 2).

Moreover, in general, the life of a battery is defined by each battery manufacturer, and refers to a state in which the capacitance has been decreased to about 50 to 60% of the initial capacitance due to, for example, about 500 to 600 times charging and discharging. In addition, beyond this state, the expected operation of the mobile terminal device cannot be guaranteed due to an increase of internal resistance, etc.

Therefore, it is necessary to accurately and clearly output the life of a battery to the user in order to guarantee expected operations of the mobile terminal device.

Patent Document 1: Japanese Unexamined Patent Application, First Publication No. H05-74501
Patent Document 2: Japanese Unexamined Patent Application, First Publication No. 2004-264303

DISCLOSURE OF THE INVENTION

Problems to be Solved by the Invention

Incidentally, since a battery can be removed from and mounted to a mobile terminal device, it is difficult to determine a life state of the battery in a case in which the battery has been replaced.

The present invention has been made in view of the aforementioned problem, and an object thereof is to provide a portable electronic device and a method for controlling the same, which are capable of accurately determining the life of a battery even in a case in which the battery has been replaced, etc., by way of a simple configuration without increasing the cost.

Means for Solving the Problems

In order to solve the abovementioned problems, a portable electronic device according to the present invention is characterized by including: a storage unit; a voltage measuring unit that measures, each time charging of a rechargeable battery mounted occurs, a voltage of the rechargeable battery; a control unit that performs control such that information on a number of times charging identified based on a voltage value measured via the voltage measuring unit is stored in the storage unit; and an information acquisition unit that acquires information from outside thereof, in which, in a case in which information on the number of times charging the rechargeable battery has been acquired via the information acquisition unit, the control unit performs a predetermined information update based on the information on the number of times charging.

Moreover, in the portable electronic device, it is preferable that the control unit measures, each time charging of the rechargeable battery is completed, a voltage of the rechargeable battery via the voltage measuring unit.

In addition, in the portable electronic device, it is preferable that the control unit measures, each time charging of the rechargeable battery is started, a voltage of the rechargeable battery via the voltage measuring unit.

Furthermore, in the portable electronic device, it is preferable that the rechargeable battery has ID information unique thereto, and the storage unit associates and stores the ID information of the rechargeable battery and the information on the number of times charging.

Moreover, in the portable electronic device, it is preferable that the storage unit is configured such that the information on the number of times charging and the ID information thus stored are retained even in a case in which the rechargeable battery is removed, and when the rechargeable battery is mounted, the control unit confirms whether ID information of the rechargeable battery is stored in the storage unit, in a case in which the ID information is stored in the storage unit, performs a predetermined information update based on the information on the number of times charging which corresponds to the ID information, and in a case in which the ID information is not stored in the storage unit, acquires information on the number of times charging the rechargeable battery via the information acquisition unit, and performs a predetermined information update based on the information on the number of times charging thus acquired.

In addition, it is preferable that the portable electronic device further includes an output unit that outputs a variety of information, in which the control unit performs control as the predetermined information update such that the output unit outputs information on life of the rechargeable battery, based on the information on the number of times charging stored in the storage unit.

Furthermore, in the portable electronic device, it is preferable that, when the rechargeable battery is mounted, the control unit confirms whether ID information of the rechargeable battery is stored in the storage unit, and in a case in which the ID information is not stored in the storage unit, registers the ID information of the rechargeable battery in the storage unit, and stores information on the number of times charging subsequently therein in association with the ID information.

Moreover, it is preferable that the portable electronic device further includes an operation unit, in which, when the rechargeable battery is mounted, the control unit confirms whether ID information of the rechargeable battery is stored in the storage unit, and in a case in which the ID information is not stored in the storage unit, the output unit presents a first selection menu for selecting whether the rechargeable battery is an unused product, and in a case in which it has been selected as being an unused product from the first selection menu via an operation of the operation unit, controls the storage unit such that ID information of the rechargeable battery is newly registered, and stores information on the number of times charging subsequently therein in association with the ID information.

In addition, in the portable electronic device, it is preferable that, in a case in which it has been selected as being a used product from the first selection menu via an operation of the operation unit, the control unit acquires information on the number of times charging the rechargeable battery via the information acquisition unit.

Furthermore, in the portable electronic device, it is preferable that, when information on a number of times charging a mounted rechargeable battery mounted is acquired via the information acquisition unit, the control unit performs control such that the output unit outputs information that prompts acquiring of information on the number of times charging via the information acquisition unit.

Moreover, in the portable electronic device, it is preferable that, when the rechargeable battery is mounted, the control unit confirms whether ID information of the rechargeable battery is stored in the storage unit, and in a case in which the ID information is stored in the storage unit, presents via the output unit a second selection menu for selecting whether the rechargeable battery was used in another device, and in a case in which it has been selected as having been used in another device from the second selection menu via an operation of the operation unit, acquires information on the number of times charging the rechargeable battery via the information acquisition unit.

In addition, in the portable electronic device, it is preferable that, when information on a number of times charging a rechargeable battery mounted is acquired via the information acquisition unit, the control unit performs control such that the output unit outputs information that prompts acquiring of information on the number of times charging via the information acquisition unit.

Furthermore, in the portable electronic device, it is preferable that, in a case in which it has been selected as having not been used in another device from the second selection menu via an operation of the operation unit, the control unit performs a predetermined information update based on information on the number of times charging stored in the storage unit.

Moreover, in the portable electronic device, it is preferable that the information acquisition unit includes a communication unit that acquires information via communication, and the control unit acquires information on the number of times charging the rechargeable battery mounted from the other device by using communication via the communication unit.

In addition, in the portable electronic device, it is preferable that the communication unit is configured with a direct communication unit that performs wireless or wired direct communication with the other device.

In order to solve the abovementioned problems, in a method of controlling a portable electronic device, to which a rechargeable battery can be mounted and removed therefrom, and which includes a storage unit configured so as to retain at least a part of information stored even if the rechargeable battery is removed, and an information acquisition unit that acquires information from outside thereof, the method is characterized by including the steps of: measuring, each time charging of the rechargeable battery mounted occurs, a voltage of a mounted rechargeable battery; identifying information on a number of times charging based on a value of the voltage thus measured; and storing the information on the number of times charging thus identified in the storage unit; in which, in a case in which information on the number of times charging the rechargeable battery has been acquired via the information acquisition unit, a predetermined information update is performed based on the information on the number of times charging.

Effects of the Invention

According to the present invention, the life of a battery can be accurately determined even in a case in which the battery has been replaced, etc.

BRIEF DESCRIPTION OF THE DRAWINGS

FIG. 7 is a second flowchart illustrating the method of determining the battery life.

Figure 1:
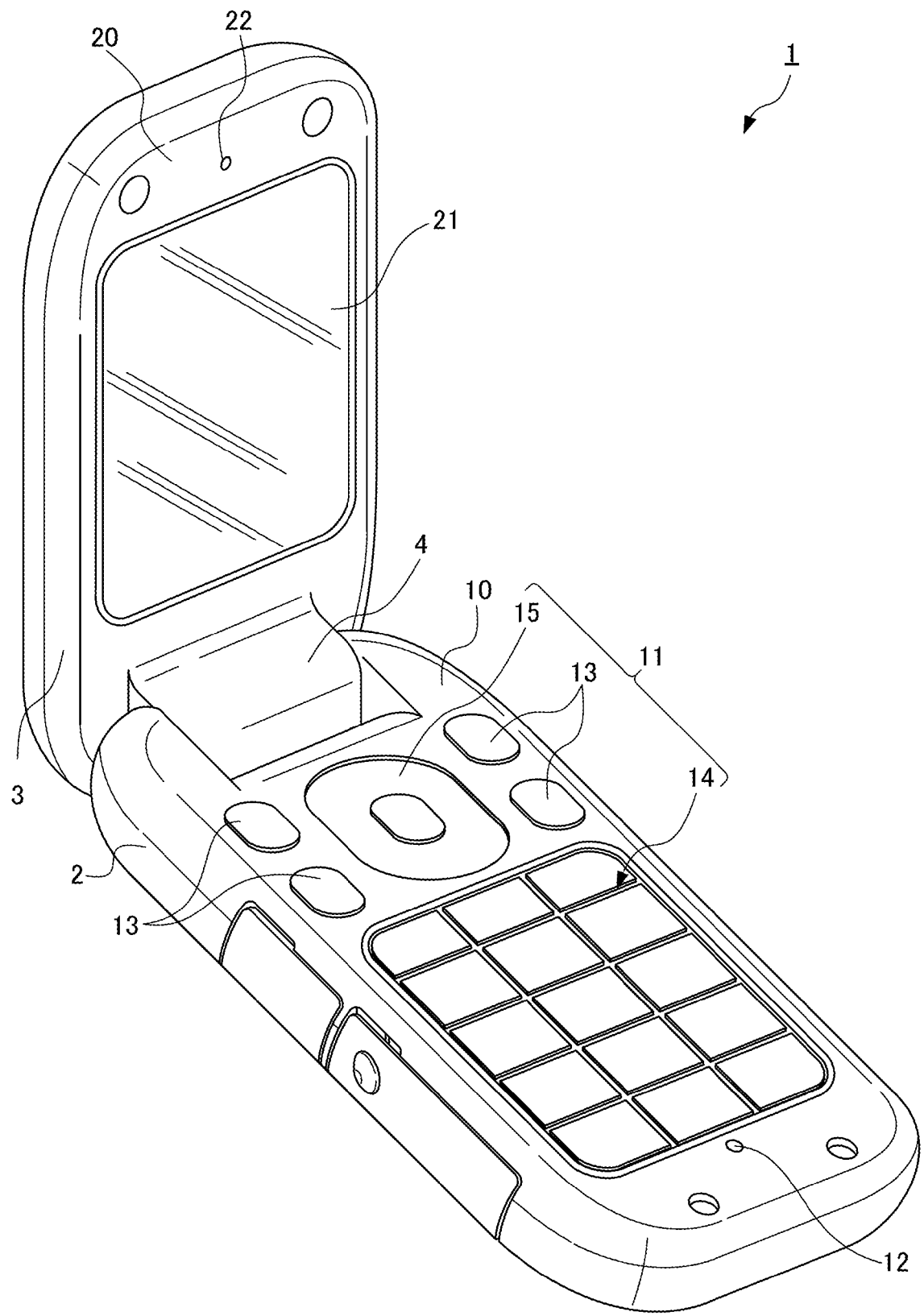
FIG. 1 is a perspective view showing an appearance of a cellular telephone device according to the present invention.

EXPLANATION OF REFERENCE NUMERALS 1 cellular telephone device
21 display (output unit)
32 rechargeable battery
42 storage unit
45 speaker (output unit)
48 control block
49 information acquisition unit
100 voltage measuring unit
101 control unit
102 magnetic field communication unit

PREFERRED MODE FOR CARRYING OUT THE INVENTION

A description is provided hereinafter regarding an embodiment of the present invention.

FIG. 1 is a perspective view showing an appearance of a cellular telephone device 1 as an example of a portable electronic device according to the present invention. It should be noted that, although a cellular telephone device is described hereinafter, the present invention is not limited thereto, and may be a PHS (Personal Handyphone System), a PDA (Personal Digital Assistant), a portable navigation device, a notebook PC or the like.

The cellular telephone device 1 is configured to include an operation unit side body 2 and a display unit side body 3. The operation unit side body 2 is configured to include on a front face 10 thereof an operation button set 11 and a microphone 12 to which sounds, which a user of the cellular telephone device 1 produces during a phone call, are input. The operation key set 11 includes: feature setting operation buttons 13 for operating various settings and various features such as a telephone number directory feature and a mail feature; input operation buttons 14 for inputting digits of a telephone number and characters for mail; and a selection operation button 15 that performs selection of the various operations and scrolling.

The display unit side body 3 is configured to include, on a front face portion 20, a display 21 for displaying a variety of information, and a sound output unit 22 for outputting sound of the other party of the conversation.

An upper end portion of the operation unit side body 2 and a lower end portion of the display unit side body 3 are connected via a hinge mechanism 4. The cellular telephone device 1 can be in a state where the operation unit side body 2 and the display unit side body 3 are apart from each other (opened state), and in a state where the operation unit side body 2 and the display unit side body 3 are contacting each other (folded state), as the operation unit side body 2 and the display unit side body 3, connected via the hinge mechanism 4, pivot with respect to each other.

It should be noted that, although FIG. 1 shows a so-called flip-type cellular telephone device, the present invention is not limited thereto, and the cellular telephone device 1 may be of: a slider type in which one body slides to one direction from a state in which the operation unit side body 2 and the display unit side body 3 are mutually superimposed; or a rotating type (turning type) in which one body is rotated around an axis line along the direction in which the operation unit side body 2 and the display unit side body 3 are superimposed.

Figure 2:
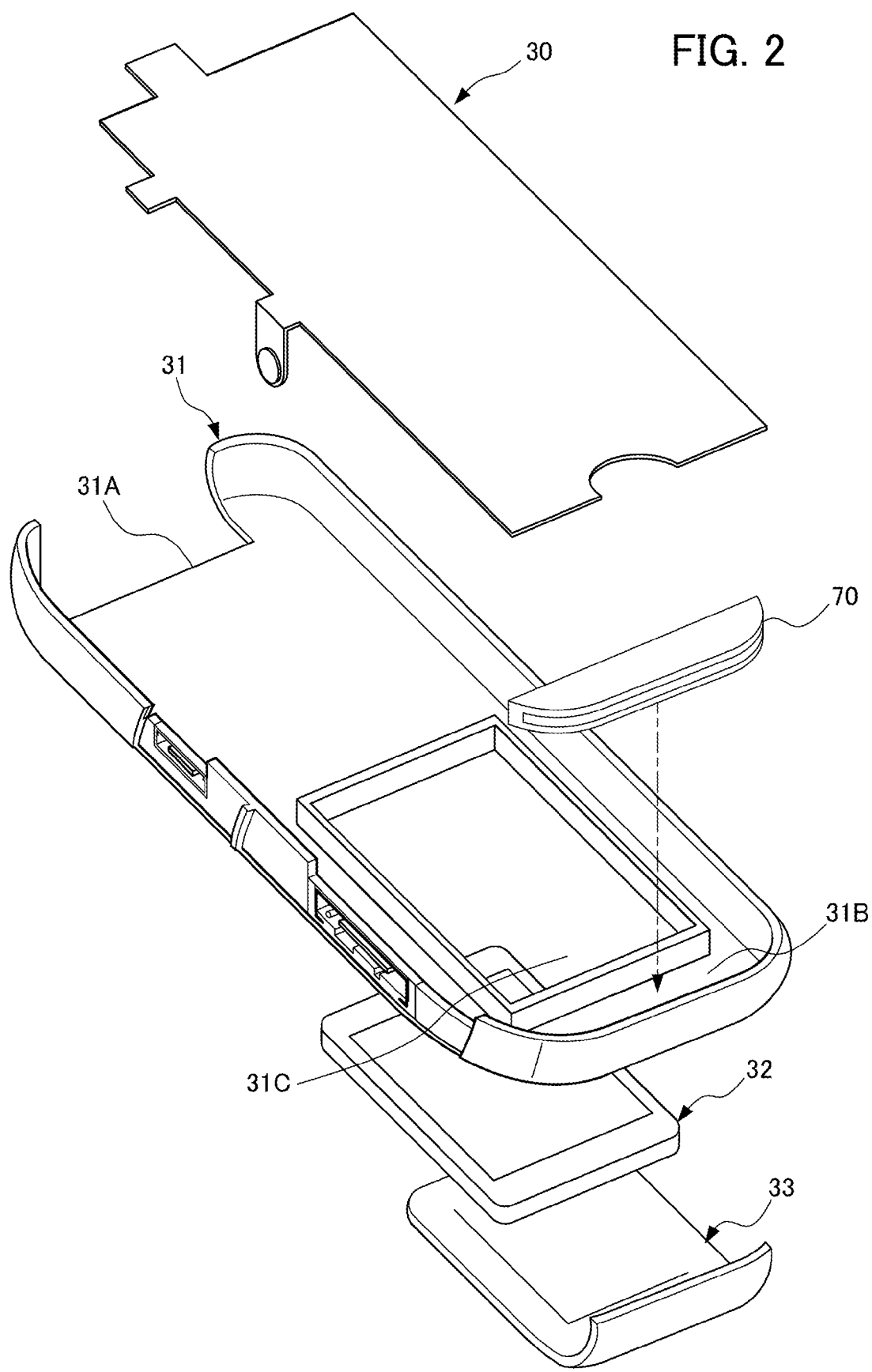
FIG. 2 is a perspective view showing a configuration of an operation unit side body included in the cellular telephone device according to the present invention.

In addition, FIG. 2 is an exploded perspective view of a part of the operating unit side body 2. As shown in FIG. 2, the operation unit side body 2 is composed of a circuit board 30, a rear case portion 31, a rechargeable battery 32 that is a rechargeable cell, and a rechargeable-battery cover 33.

On the circuit board 30, an element such as a CPU (corresponding to a control block 48 to be described later) that performs predetermined arithmetic processing is mounted, and a predetermined signal is transmitted to the CPU when the user operates the operation key set 11 on the front portion 10. Moreover, battery terminals 46 to be described later are mounted on the circuit board 30.

The rear case portion 31 includes: a hinge mechanism fixing portion 31A that fixes the hinge mechanism 4; a main antenna housing portion 31B that houses a main antenna 70 which communicates using a predetermined usable frequency band; and a rechargeable-battery housing portion 31C that houses the rechargeable battery 32.

Figure 3:
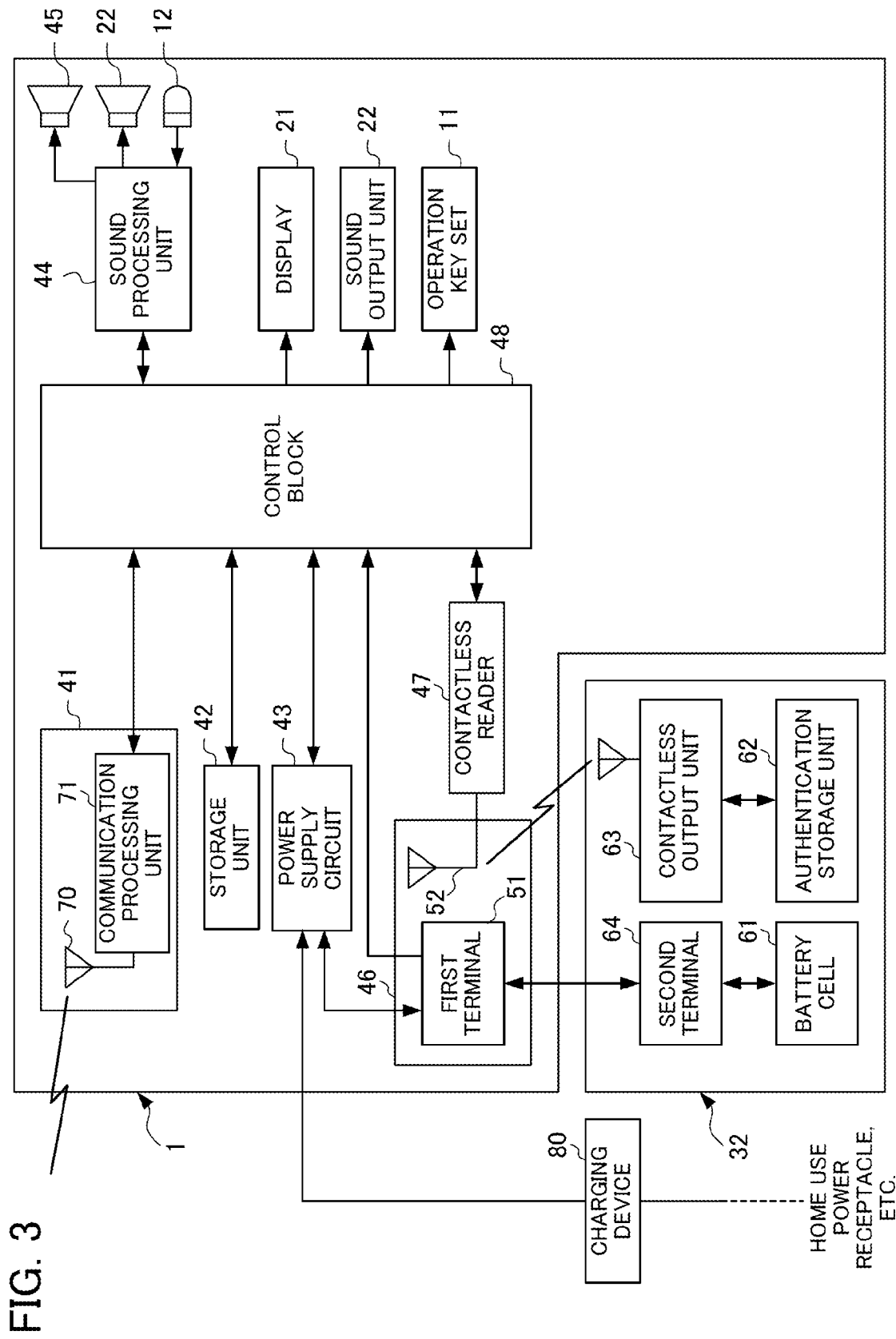
FIG. 3 is a block diagram showing functions of the cellular telephone device according to the present invention.

FIG. 3 is a functional block diagram showing functions of the cellular telephone device 1. As shown in FIG. 3, the cellular telephone device 1 includes the operation key set 11, the microphone 12, the display 21, the sound output unit 22, a communication unit 41, a storage unit 42, a power supply circuit 43, a sound processing unit 44, a speaker 45, the battery terminals 46, a contactless reader 47, and the control block 48 that controls each unit. It should be noted that the battery terminals 46 include a first terminal 51 and an RFID antenna 52 connected to the contactless reader 47. Furthermore, the rechargeable battery 32 includes a battery cell 61, an authentication storage unit 62, a contactless output unit 63, and a second terminal 64.

Moreover, when the cellular telephone device 1 is placed on a predetermined charging device 80 compatible with the cellular telephone device 1, connecting terminals of the charging device 80 and those of the power supply circuit 43 come in contact with each other, the connecting terminals being compatible with each other, and a circuit connection is established, thereby charging the battery cell 61 of the rechargeable battery 32.

In other words, a charging circuit that establishes a circuit connection between the charging device 80 and the rechargeable battery 32 is formed in a portion of the power supply circuit 43. Moreover, the power supply circuit 43 is configured such that an ON state and an OFF state of a power supply operation from the charging device 80 to the rechargeable battery 32 can be switched, which is performed by the charging circuit based on an instruction from the control block 48.

The communication unit 41 includes: the main antenna 70 that communicates with external devices via a predetermined usable frequency band; and a communication processing unit 71 that performs signal processing such as modulation processing or demodulation processing. In addition, the communication unit 41 is supplied with a power supply voltage from the rechargeable battery 32 via the power supply circuit 43. Furthermore, similarly to a general cellular telephone device, the communication unit 41 can be connected to a public communication network via a nearest base station, for example, by radio communication such as of a CDMA2000__1x method.

The storage unit 42 is nonvolatile memory media, and ID information on a plurality of rechargeable batteries together with information on each operating condition is stored therein. Moreover, it is assumed that the configuration is made such that the contents stored in the storage unit 42 cannot be rewritten by the user.

The power supply circuit 43 converts a power supply voltage, which is supplied from the rechargeable battery 32, into a predetermined voltage, and supplies the converted voltage to each portion of the cellular telephone device 1.

The sound processing unit 44 is controlled by the control block 48, outputs sound of the other party of the conversation from the sound output unit 22, and performs signal processing on the user's voice that is input from the microphone 12. Furthermore, the sound processing unit 44 performs, for example, reproduction processing of music data stored in the storage unit 42 to be output from the speaker 45.

The first terminal 51 is connected to the second terminal 64 of the rechargeable battery 32, and supplies a power supply voltage, which is supplied from the battery cell 61, to the power supply circuit 43.

Moreover, as shown in FIG. 3, in the rechargeable battery 32, a circuit connection is established such that the authentication storage unit 62 and the contactless output unit 63 are connected to each other. In addition, the authentication storage unit 62 stores unique ID information for identifying a rechargeable battery. More specifically, the authentication storage unit 62 is configured such that a data area sandwiched between a start bit and a stop bit is provided, and serial data including a parity bit for error correction can be further stored therein. Moreover, as ID information, the data area stores in a serial sequence: ID information that is unique to a rechargeable battery, such as a serial number of the rechargeable battery 32; type information on the rechargeable battery, such as lithium-ion type, nickel-hydride type, or nickel-cadmium type; and information such as manufacturer classification, capacitance value, etc.

Figure 4:
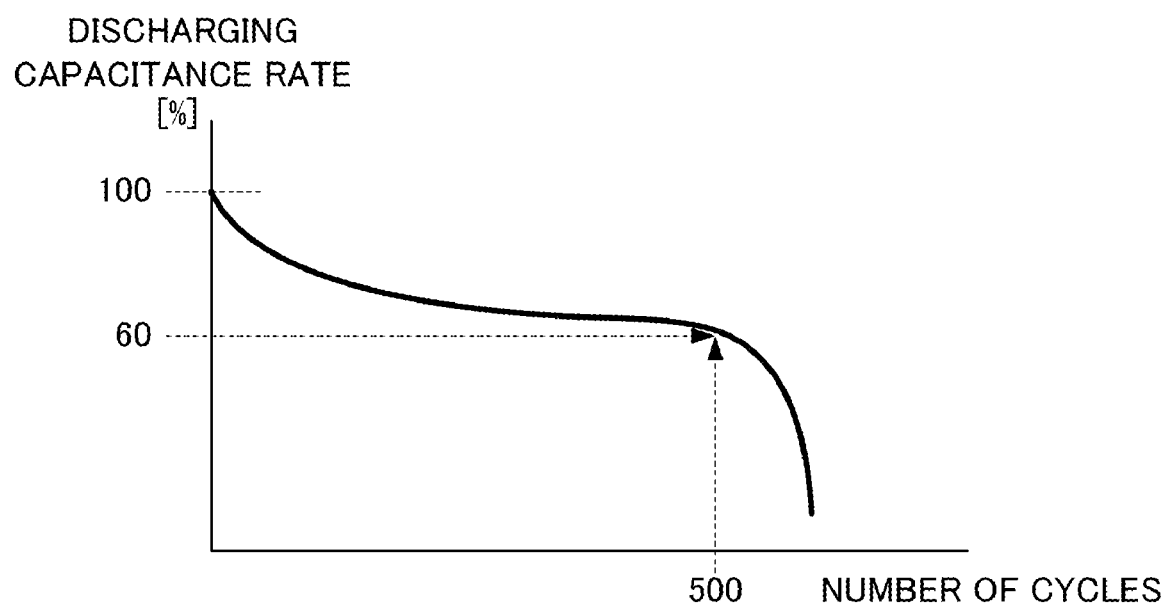
FIG. 4 is graph showing a relationship between a number of cycles and a discharging capacitance rate of a rechargeable battery.

Here, characteristics of the rechargeable battery 32 are described. For example, in a case in which the rechargeable battery 32 is a lithium ion battery, generally, the capacitance is decreased to approximately around 60% due to approximately around 500 cycles of charging/discharging operations. Moreover, a state in which the capacitance is decreased to approximately around 60% is referred to as a state in which the life of the rechargeable battery has reached an end. It should be noted that the rechargeable battery 32 is still usable even in the state in which the life of the rechargeable battery has reached the end; however, in such a state, the impedance has also increased, and thus it is difficult to achieve the desired performance. In addition, after the capacitance has fallen below approximately 60%, the capacitance will decrease at an accelerated pace (see FIG. 4).

Therefore, it is desirable to count the number of times charging and discharging the rechargeable battery, and to output the life of the rechargeable battery to the user in accordance with the count; however, in a case in which the battery has been replaced, the life of the battery cannot be continuously measured, and thus it is difficult to accurately determine the life of the battery. For example, the rechargeable battery is removed from the cellular telephone device, and the rechargeable battery is charged by using a special charging device or the like. Then, in a case in which the rechargeable battery is subsequently mounted to the cellular telephone device again, although the cycle number itself of charging the rechargeable battery 32 has been updated, such update information does not remain in the rechargeable battery 32. Therefore, it is difficult to determine an accurate charging life. Accordingly, in the present invention, a configuration and method are proposed, which are capable of accurately determining the life of a battery even in a case in which the battery has been replaced, etc., by way of a simple configuration without increasing the cost.

Furthermore, the contactless reader 47 can perform contactless-type (radio) communication with the contactless output unit 63 via the RFID antenna 52 in accordance with control of the control block 48 by using an RFID (Radio Frequency Identification) technique, and read ID information stored in the authentication storage unit 62 of the rechargeable battery 32.

In other words, although a direct circuit connection is not established between the contactless reader 47 and the contactless output unit 63 even in a case in which the rechargeable battery 32 is mounted to the cellular telephone device 1, upon detecting that the rechargeable battery 32 is mounted, the control block 48 is firstly activated in the background (not accompanied with display or sound). In addition, the contactless reader 47 starts radio transmission of an authentication request based on an instruction of the control block 48. Moreover, the contactless output unit 63 receives an authentication request signal from the contactless reader 47, thereby generating operating power by electromagnetic induction, without being supplied with power from the battery cell 61 in the rechargeable battery 32. In addition, the contactless output unit 63 reads ID information stored in the authentication storage unit 62 by using the operating power as a power supply, and wirelessly outputs the ID information to the contactless reader 47.

Figure 5:
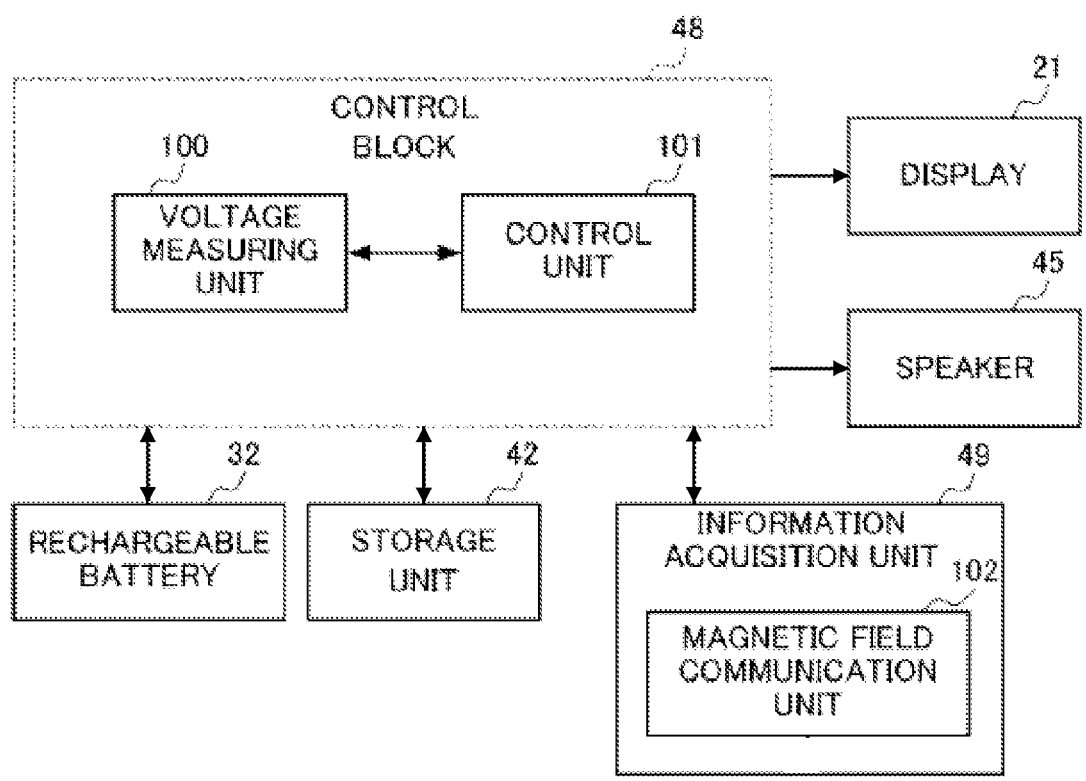
FIG. 5 is a block diagram showing a configuration of a control block.

Next, a configuration of the control block 48 is described. As shown in FIG. 5, the control block 48 includes a voltage measuring unit 100 and a control unit 101. The voltage measuring unit 100 is connected to the rechargeable battery 32, and measures a voltage value of the rechargeable battery 32. Each time charging of the rechargeable battery 32 is started or completed, the control unit 101 performs control such that a voltage of the rechargeable battery 32 is measured by the voltage measuring unit 100, and information on the number of times charging, which has been identified based on a value of the measured voltage, is stored in the storage unit 42.

Moreover, the cellular telephone device 1 includes an information acquisition unit 49 that acquires information on the number of times charging the rechargeable battery 32 from outside thereof.

In addition, the information acquisition unit 49 may be configured to have a magnetic field communication unit 102 that is configured with RFID for acquiring information via magnetic field communication. In a case of such a configuration, the control unit 101 acquires information on the number of times charging the mounted rechargeable battery 32 by utilizing magnetic field communication with another device via the magnetic field communication unit 102.

Furthermore, the information acquisition unit 49 may be configured to be able to perform short distance radio communication such as of Bluetooth (registered trademark) as well as wired communication such as of USB (Universal Serial Bus). In this way, the information acquisition unit 49 is configured with a direct communication unit that performs direct communication between terminals without involving a base station.

Moreover, the information acquisition unit 49 is not limited to RFID as long as it is configured to be able to acquire information on the number of times charging from the outside thereof. For example, the information acquisition unit 49 may be a communication means configured with infrared-ray communication (IrDA: Infrared Data Association), etc., or may be an interface such as a detachable memory card.

In addition, although the information acquisition unit 49 is described as being independent of the communication unit 41 in the present embodiment, the information acquisition unit 49 may be configured with the communication unit 41. In a case of such a configuration, the cellular telephone device 1 acquires information on the number of times charging the rechargeable battery 32 via mail or the like transmitted from an external device.

It should be noted that the information acquisition unit 49 may be configured to be able to acquire battery information indirectly via a base station or the like. It is more preferable that the information acquisition unit 49 is configured with a direct communication unit that can acquire information without time delay in a case in which a rechargeable battery is replaced in a situation such as in a basement or a building from which a radio wave is unlikely to reach a base station.

Furthermore, in a case in which information on the number of times charging has been acquired via the information acquisition unit 49, the control unit 101 performs a predetermined information update based on the information on the number of times charging.

With such a configuration, according to the present invention, in a case in which the rechargeable battery 32 has been replaced (including a case in which the original rechargeable battery 32 is mounted again), information on the number of times charging the rechargeable battery 32 thus replaced, which is stored in another device, is acquired, and a predetermined information update is performed based on the information on the number of times charging thus acquired. Accordingly, the life of the rechargeable battery 32 can be accurately determined by way of a simple configuration without increasing the cost.

Moreover, the rechargeable battery 32 has unique ID information as described above. In addition, the storage unit 42 is configured such that the information on the number of times charging thus stored and the ID information are retained even in a case in which the rechargeable battery 32 is removed. Furthermore, when the rechargeable battery 32 is mounted, the control unit 101 confirms whether ID information of the rechargeable battery 32 is stored in the storage unit 42, and in a case in which the ID information is stored in the storage unit 42, a predetermined information update is performed based on the information on the number of times charging which corresponds to the ID information. Moreover, in a case in which the ID information is not stored in the storage unit 42, the control unit 101 acquires information on the number of times charging the rechargeable battery 32 via the information acquisition unit 49, and performs a predetermined information update based on the information on the number of times charging thus acquired.

With such a configuration, according to the present invention, in a case in which the rechargeable battery 32 has been replaced (including a case in which the original rechargeable battery 32 is mounted again), it is determined whether ID information of the rechargeable battery 32 is stored in the storage unit 42, i.e. whether the rechargeable battery 32 was mounted to the cellular telephone device 1 in the past, and the information on the number of times charging is stored in the storage unit 42. In addition, in accordance with such determination, the information on the number of times charging the rechargeable battery 32 stored in another device is acquired, and a predetermined information update is performed based on the information on the number of times charging thus acquired. Therefore, the life of the rechargeable battery 32 can be accurately determined by way of a simple configuration without increasing the cost.

Furthermore, the cellular telephone device 1 includes an output unit (corresponding to the display 21 or the speaker 45) that outputs a variety of information. Moreover, the control unit 101 performs control as a predetermined information update such that information on the life of the rechargeable battery 32 is output via the display 21 or the speaker 45, based on the information on the number of times charging stored in the storage unit 42.

With such a configuration, according to the present invention, in a case in which the rechargeable battery 32 has been replaced (including a case in which the original rechargeable battery 32 is mounted again), information on the number of times charging the rechargeable battery 32, which is stored in another device, is acquired, and the information on the life of the rechargeable battery 32 is presented via the display 21 or the speaker 45, based on the information on the number of times charging thus acquired. Therefore, accurate information on the life of the rechargeable battery 32 can be clearly presented to the user by way of a simple configuration without increasing the cost.

In addition, when the rechargeable battery 32 is mounted, the control unit 101 confirms whether ID information of the rechargeable battery 32 is stored in the storage unit 42. Furthermore, in a case in which the ID information is not stored in the storage unit 42, the control unit 101 presents a first selection menu for selecting whether the rechargeable battery 32 is an unused product, via the output unit (corresponding to the display 21 or the speaker 45). Moreover, in a case in which it has been selected as being an unused product from the first selection menu via an operation of the operation key set 11, the control unit 101 controls the storage unit 42 such that the ID information of the rechargeable battery 32 is newly registered, and information on the number of times charging subsequently is stored in association with the ID information. In addition, in a case in which it has been selected as being a used product from the first selection menu via an operation of the operation key set 11, the control unit 101 causes the display 21 or the speaker 45 to output information that prompts acquiring of information on the number of times charging the rechargeable battery 32 via the information acquisition unit 49.

With such a configuration, according to the present invention, in a case in which the rechargeable battery 32 has been replaced (including a case in which the original rechargeable battery 32 is mounted again), the user is made to select from the first selection menu as to whether the replaced rechargeable battery 32 is an unused product or a used product. Furthermore, in accordance with the selection result, the rechargeable battery 32 is newly registered, or a message is displayed to acquire information on the number of times charging the rechargeable battery 32 stored in another device; therefore, the life of the rechargeable battery 32 can be accurately determined.

Moreover, when the rechargeable battery 32 is mounted, the control unit 101 confirms whether ID information of the rechargeable battery 32 is stored in the storage unit 42. In addition, in a case in which the ID information is stored in the storage unit 42, the control unit 101 presents a second selection menu for selecting whether the rechargeable battery 32 was used in another device, via the output unit (corresponding to the display 21 or the speaker 45). Furthermore, in a case in which it has been selected as having not been used in another device from the second selection menu by way of an operation of the operation key set 11, the control unit 101 performs a predetermined information update based on the information on the number of times charging stored in the storage unit 42. Moreover, in a case in which it has been selected as having been used in another device from the second selection menu via an operation of the operation key set 11, the control unit 101 controls the display 21 or the speaker 45 to output information (message) that prompts acquiring of information on the number of times charging the rechargeable battery 32 via the information acquisition unit 49.

With such a configuration, according to the present invention, in a case in which the rechargeable battery 32 has been replaced (including a case in which the original rechargeable battery 32 is mounted again), the user is made to select from the second selection menu whether the replaced rechargeable battery 32 was used in another device. In addition, in accordance with the selection result, notification is made so as to acquire information on the number of times charging the rechargeable battery 32 from another device; therefore, the life of the rechargeable battery 32 can be accurately determined.

Figure 6:
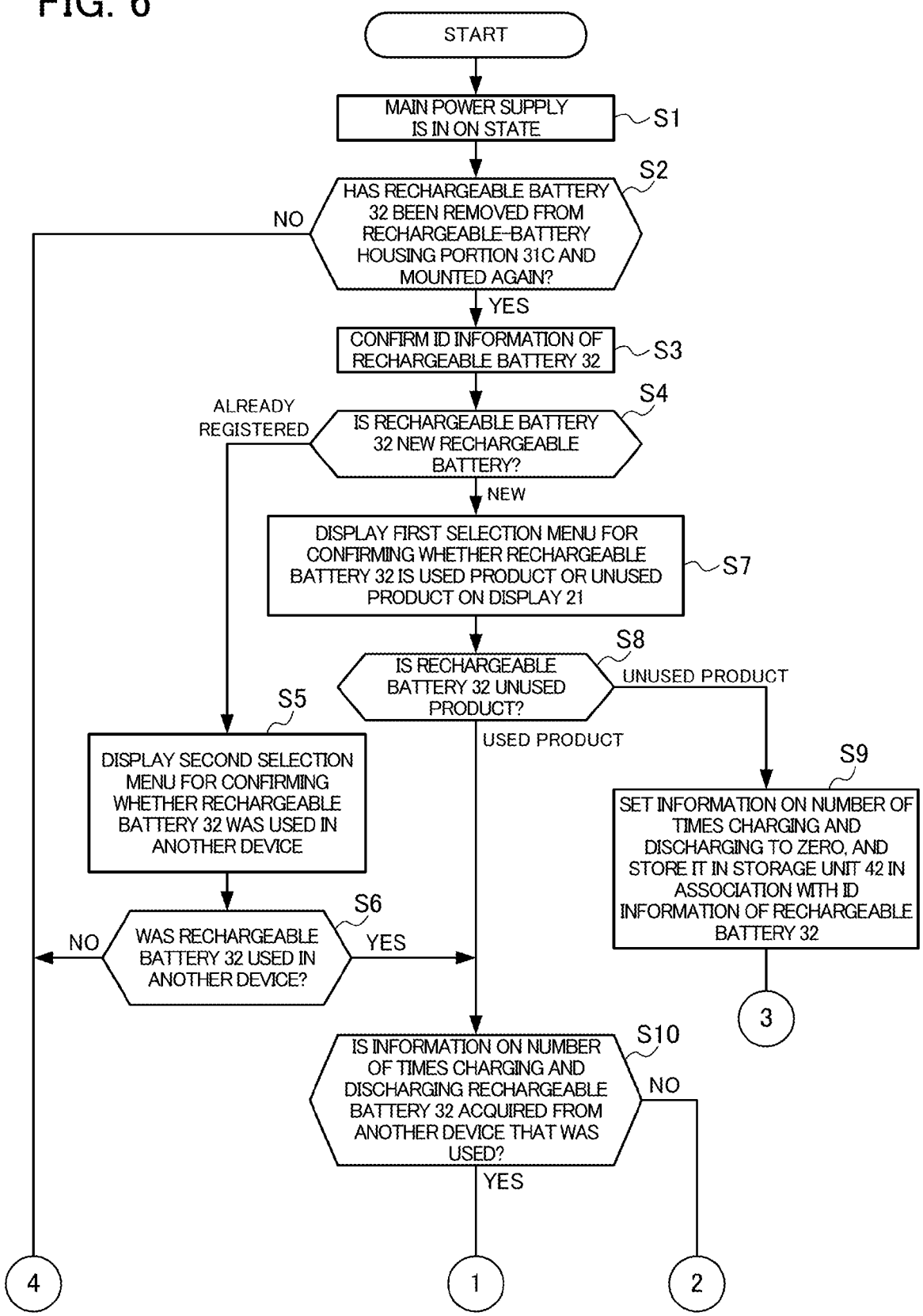
FIG. 6 is a first flowchart illustrating a method of determining battery life.

Next, the aforementioned method of accurately determining the battery life of the rechargeable battery 32 is described with reference to the flowcharts shown in FIGS. 6 and 7. It should be noted that the following assumes the rechargeable battery 32 having the contactless output unit 63, and the cellular telephone device 1 having a function to recognize it and comprehend the number of times charging and discharging to determine the battery life. Particularly, in the cellular telephone device 1, in a case in which the rechargeable battery 32 was used in another device in the past, and is mounted to the cellular telephone device 1 again, usage history (information on the number of times charging and discharging) of the rechargeable battery 32 is transferred from the other device to the cellular telephone device 1. In addition, a case is assumed in which the cellular telephone device 1 correctly outputs a determination of the battery life of the rechargeable battery 32.

In Step S1, the main power supply of the cellular telephone device 1 is turned to an ON state in response to an operation of the user, and a predetermined activation operation is performed.

In Step S2, the control unit 101 determines whether the rechargeable battery 32 was removed from the rechargeable-battery housing portion 31C and is mounted thereto again. Here, it is assumed that the cellular telephone device 1 retains history information for a case in which the rechargeable battery 32 is removed from the rechargeable-battery housing portion 31C, and a case in which the rechargeable battery 32 is mounted to the rechargeable-battery housing portion 31C. It should be noted that the history information is stored and retained, for example, in the storage unit 42. Furthermore, by referring to the history information, while the main power supply is turned from the OFF state to the ON state in Step S1, the control unit 101 can determine whether the rechargeable battery 32 was removed from the rechargeable-battery housing portion 31C.

In a case in which it has been determined that the rechargeable battery 32 was removed once from the rechargeable-battery housing portion 31C, and is mounted thereto again (Yes), the processing advances to Step S3, and in a case in which it has been determined that the rechargeable battery 32 was not removed from the rechargeable-battery housing portion 31C (No), the processing advances to Step S19, and the battery life is displayed on the display 21 without changing the information on the number of times charging and discharging.

In Step S3, the control unit 101 confirms ID information of the rechargeable battery 32.

In Step S4, based on the ID information of the rechargeable battery 32 confirmed in Step S3, the control unit 101 determines whether the rechargeable battery 32 is a new rechargeable battery or a registered rechargeable battery. The storage unit 42 stores ID information and information on the number of times charging and discharging for each rechargeable battery 32, and the control unit 101 accesses the storage unit 42 to determine whether the rechargeable battery 32 is a new one, i.e. a rechargeable battery that has never been mounted to the cellular telephone device 1 in the past. In a case in which it has been determined that the rechargeable battery 32 is a new rechargeable battery, the processing advances to Step S7, and in a case in which it has been determined that the rechargeable battery 32 is a registered rechargeable battery, the processing advances to Step S5.

In Step S5, the control unit 101 displays, on the display 21, a second selection menu for confirming whether the rechargeable battery 32 was used in another device. By operating the operation key set 11, the user selects from the second selection menu whether the rechargeable battery 32 was used in another device.

In Step S6, based on a result selected in Step S5, the control unit 101 determines whether the rechargeable battery 32 was used in another device. In a case in which it has been determined that the rechargeable battery 32 was used in another device (Yes), the processing advances to Step S10, and in a case in which it has been determined that the rechargeable battery 32 was not used in another device (No), the processing advances to Step S19.

In Step S7, the control unit 101 displays, on the display 21, a first selection menu for confirming whether the rechargeable battery 32 is a used product or an unused product. By operating the operation key set 11, the user selects from the first selection menu whether the rechargeable battery 32 is an unused product.

In Step S8, based on a result selected in Step S7, the control unit 101 determines whether the rechargeable battery 32 is an unused product. In a case in which it has been determined that the rechargeable battery 32 is an unused product, the processing advances to Step S9, and in a case in which it has been determined that the rechargeable battery 32 is an used product, the processing advances to Step S10.

In Step S9, the control unit 101 sets the information on the number of times charging and discharging to zero, and stores it in the storage unit 42 in association with the ID information of the rechargeable battery 32.

In Step S10, the control unit 101 displays, on the display 21, information (a message) as to whether usage history information (information on the number of times charging and discharging) on the rechargeable battery 32 is acquired from another device thus used. By operating the operation key set 11, the user selects whether information on the number of times charging and discharging the rechargeable battery 32 is acquired from another device. In a case in which it has been selected to acquire the information on the number of times charging and discharging the rechargeable battery 32 from another device (Yes), the processing advances to Step S14, and in a case in which it has been selected not to acquire the information on the number of times charging and discharging the rechargeable battery 32 from another device (No), the processing advances to Step S11.

In Step S11, since the life of the rechargeable battery 32 cannot be accurately determined, the control unit 101 performs notification that the display (battery life meter) indicating the battery life is turned off (removed) from the display 21.

In Step S12, the control unit 101 removes the battery life meter from the display 21. It should be noted that, in a case in which the user has performed an operation to acquire information on the number of times charging and discharging the rechargeable battery 32 from another device (in Step S13), the processing advances to Step S14.

In Step S14, the control unit 101 displays, on the display 21, a menu for selecting a means (for example, an interface, etc. such as RFID, IrDA and a memory card) for acquiring information on the number of times charging and discharging the rechargeable battery 32 from another device.

In Step S15, the control unit 101 makes the user select one means from the menu that is displayed on the display 21 in Step S14.

In Step S16, in accordance with the means selected by the user, the control unit 101 performs preliminary preparation for communicating with another device. It should be noted that the preliminary preparation refers to, for example, preparation or the like (handshake) for confirming whether communication can be performed with another device.

In Step S17, the control unit 101 receives information on the number of times charging and discharging the rechargeable battery 32, which is transmitted from another device. It should be noted that, in a case in which the information transfer from another device has failed, the processing in this step is repeated, and retry is performed for a predetermined number of times. Moreover, in a case in which the retry for the predetermined number of times has failed, the processing advances to Step S11.

In Step S18, the control unit 101 stores the information on the number of times charging and discharging the rechargeable battery 32, which has been transmitted from another device, in the storage unit 42, in association with the ID information of the rechargeable battery 32.

In Step S19, the control unit 101 updates the battery life meter, based on the information on the number of times charging and discharging stored in the storage unit 42 in Step S18.

Method of Calculating and Method of Correcting Information on Number of Times Charging and Discharging In addition, for example, the cellular telephone device 1 according to the present invention performs a method of calculating and a method of correcting information on the number of times charging and discharging as follows.

By measuring a voltage state of the rechargeable battery 32, the control unit 101 counts the number of cycles of charging and discharging the rechargeable battery 32. For example, when electrically connected to the charger, the control unit 101 measures a battery voltage of the rechargeable battery 32 before starting charging (a first weighting coefficient X according to deterioration is factored therein), thereby counting the number of times discharging. Moreover, when electrically disconnected from the charger, the control unit 101 measures a battery voltage of the rechargeable battery 32 after completing the charging (a second weighting coefficient Y according to deterioration is factored therein), thereby counting the number of times charging.

Next, the first weighting coefficient X and the second weighting coefficient Y are described. It should be noted that the first weighting coefficient X and the second weighting coefficient Y are stored in the storage unit 42, and are referred to when counting the number of times charging and discharging.

The first weighting coefficient X is determined, for example, based on the change of capacitance rate relative to the discharging voltage as follows
(a battery voltage immediately before starting charging→the first weighting coefficient X):

4.20 V or higher→0 times;
4.00 V→0.1 times;
3.88 V→0.2 times;
3.83 V→0.3 times;
3.77 V→0.4 times;
3.73 V→0.5 times;
3.69 V→0.6 times;
3.67 V→0.7 times;
3.65 V→0.8 times;
3.60 V→0.9 times; and
3.30 V→1.0 time.

The second weighting coefficient Y is determined, for example, based on the change of charging rate relative to the charging voltage as follows
(a battery voltage immediately after completing charging→the second weighting coefficient Y):

3.60 V→0 times;
3.80 V→0.1 times;
3.84 V→0.2 times;
3.88 V→0.3 times;
3.92 V→0.4 times;
3.95 V→0.5 times;
3.98 V→0.6 times;
4.02 V→0.7 times;
4.05 V→0.8 times;
4.10 V→0.9 times; and
4.20 V→1.0 time.

In this way, in the cellular telephone device 1 according to the present invention, information on the number of times charging and discharging the rechargeable battery 32 having ID information is calculated, and the battery life is determined based on the information on the number of times charging and discharging, and the cellular telephone device 1 reads the ID information of the rechargeable battery 32 in a case in which the rechargeable battery 32 is mounted. In addition, in a case in which the ID information is new, confirmation is made with the user as to whether the rechargeable battery 32 is an unused product. Furthermore, in a case in which it is a used product, the user is notified so as to transfer the usage history information (information on the number of times charging and discharging) on the rechargeable battery 32 from another device via the information acquisition unit 49. Moreover, in a case in which the information cannot be acquired, and the used product continues to be used, the user is notified that life determination is not performed. Therefore, an error in determining the life of the rechargeable battery 32 can be prevented, and the operating condition and the remaining life of the rechargeable battery 32 can be accurately determined.

It should be noted that, with a configuration in which devices can perform intercommunication to transfer information on the number of times charging and discharging, by mutually transferring information on the number of times charging and discharging, the information on the number of times charging and discharging the rechargeable battery 32 can be shared and updated with each other.

In the embodiment, although information on the rechargeable battery may be output to a display as well as a sound output unit, it is not limited thereto. Information on the rechargeable battery may be output to an externally connected monitor, and it may be output to a wirelessly connected external display unit via an antenna. In this way, in addition to the display and the sound output unit, an output unit may be an external connection terminal or a radio communication unit, and various forms thereof can be contemplated.

The invention claimed is:

1. A portable electronic device, comprising:
a storage unit;
a voltage measuring unit that measures, each time charging of a rechargeable battery mounted occurs, a voltage of the rechargeable battery;
a control unit that performs control such that information on a number of times charging identified based on a voltage value measured via the voltage measuring unit is stored in the storage unit;
an information acquisition unit that acquires information from outside thereof; and
an operation unit,
wherein, in a case in which information on a number of times charging the rechargeable battery has been acquired via the information acquisition unit, the control unit performs a predetermined information update based on the information on the number of times charging,
wherein the rechargeable battery has unique identification (ID) information thereto,
wherein the storage unit associates and stores the ID information of the rechargeable battery and the information on the number of times charging, and
wherein, when the rechargeable battery is mounted, the control unit confirms whether ID information of the rechargeable battery is stored in the storage unit, and in a case in which the ID information is not stored in the storage unit, the output unit presents a first selection menu for selecting whether the rechargeable battery is an unused product, and in a case in which it has been selected as being an unused product from the first selection menu via an operation of the operation unit, controls the storage unit such that ID information of the rechargeable battery is newly registered, and stores information on a number of times charging subsequently therein in association with the ID information.

2. The portable electronic device according to claim 1, wherein the control unit measures, each time charging of the rechargeable battery is completed, a voltage of the rechargeable battery via the voltage measuring unit.

3. The portable electronic device according to claim 2, wherein the control unit measures, each time charging of the rechargeable battery is started, a voltage of the rechargeable battery via the voltage measuring unit.

4. The portable electronic device according to claim 1,
wherein the storage unit is configured such that the information on the number of times charging and the ID information thus stored are retained, even in a case in which the rechargeable battery is removed, and wherein, when the rechargeable battery is mounted, the control unit confirms whether the ID information of the rechargeable battery is stored in the storage unit, in a case in which the ID information is stored in the storage unit, performs a predetermined information update based on the information on the number of times charging which corresponds to the ID information, and in a case in which the ID information is not stored in the storage unit, acquires information on a number of times charging the rechargeable battery via the information acquisition unit, and performs a predetermined information update based on the information on the number of times charging thus acquired.

5. The portable electronic device according to claim 4, further comprising an output unit that outputs a variety of information,
   wherein the control unit performs control as the predetermined information update such that the output unit outputs information on life of the rechargeable battery, based on the information on the number of times charging stored in the storage unit.

6. The portable electronic device according to claim 4, wherein, when the rechargeable battery is mounted, the control unit confirms whether ID information of the rechargeable battery is stored in the storage unit, and in a case in which the ID information is not stored in the storage unit, registers the ID information of the rechargeable battery in the storage unit, and stores information on a number of times charging subsequently therein in association with the ID information.

7. The portable electronic device according to claim 1, wherein, in a case in which it has been selected as being a used product from the first selection menu via an operation of the operation unit, the control unit acquires information on a number of times charging the rechargeable battery via the information acquisition unit.

8. The portable electronic device according to claim 7, wherein, when information on a number of times charging a rechargeable battery mounted is acquired via the information acquisition unit, the control unit performs control such that the output unit outputs information that prompts acquiring of information on a number of times charging via the information acquisition unit.

9. The portable electronic device according to claim 1, wherein, when the rechargeable battery is mounted, the control unit confirms whether ID information of the rechargeable battery is stored in the storage unit, and in a case in which the ID information is stored in the storage unit, presents via the output unit a second selection menu for selecting whether the rechargeable battery was used in another device, and in a case in which it has been selected as having been used in another device from the second selection menu via an operation of the operation unit, acquires information on a number of times charging the rechargeable battery via the information acquisition unit.

10. The portable electronic device according to claim 9, wherein, when information on a number of times charging a rechargeable battery mounted is acquired via the information acquisition unit, the control unit performs control such that the output unit outputs information that prompts acquiring of information on a number of times charging via the information acquisition unit.

11. The portable electronic device according to claim 9, wherein, in a case in which it has been selected as having not been used in another device from the second selection menu via an operation of the operation unit, the control unit performs a predetermined information update based on information on a number of times charging stored in the storage unit.

12. The portable electronic device according to claim 1,
    wherein the information acquisition unit includes a communication unit that acquires information via communication from an external device, and
        wherein the control unit acquires information on a number of times charging the mounted rechargeable battery from the external device by using communication via the communication unit.

13. The portable electronic device according to claim 12, wherein the communication unit is configured with a direct communication unit that performs wireless or wired direct communication with the external device.

14. A method of controlling a portable electronic device to which a rechargeable battery can be mounted and removed therefrom, and which includes a storage unit configured so as to retain at least a part of information stored even if the rechargeable battery is removed, and an information acquisition unit that acquires information from outside thereof, the method comprising the steps of:
    measuring by a voltage measuring unit, each time charging of the rechargeable battery mounted occurs, a voltage of a rechargeable battery mounted;
    identifying information on a number of times charging based on a value of the voltage thus measured;
    storing the information on the number of times charging thus identified in the storage unit;
    in a case in which information on a number of times charging the rechargeable battery has been acquired via the information acquisition unit, performing a predetermined information update based on the information on the number of times charging;
    when the rechargeable battery is mounted, a control unit confirms whether identification (ID) information of the rechargeable battery is stored in the storage unit;
    in a case in which the ID information is not stored in the storage unit, presenting by an output unit a first selection menu for selecting whether the rechargeable battery is an unused product, and
    in a case in which it has been selected as being an unused product from the first selection menu, controlling the storage unit such that ID information of the rechargeable battery is newly registered, and storing information on a number of times charging subsequently therein in association with the ID information.

* * * * *